United States Patent
Nakamura et al.

(10) Patent No.: US 7,635,906 B2
(45) Date of Patent: Dec. 22, 2009

(54) ULTRAVIOLET SENSOR

(75) Inventors: Kazutaka Nakamura, Yasu (JP); Yoshihiro Ito, Yasu (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 12/257,678

(22) Filed: Oct. 24, 2008

(65) Prior Publication Data

US 2009/0057805 A1 Mar. 5, 2009

Related U.S. Application Data

(63) Continuation of application No. PCT/JP2006/318131, filed on Sep. 13, 2006.

(30) Foreign Application Priority Data

Apr. 25, 2006 (JP) .............................. 2006-120208

(51) Int. Cl.
*H01L 31/0203* (2006.01)
*H01L 31/06* (2006.01)
*H01L 31/0256* (2006.01)

(52) U.S. Cl. ........................ 257/434; 257/464; 257/613; 257/E31.093; 257/E31.124

(58) Field of Classification Search ................. 257/434, 257/464, 613, E31.093, E31.124
See application file for complete search history.

(56) References Cited

U.S. PATENT DOCUMENTS 4,557,987 A * 12/1985 Shirai et al. ................. 430/57.7
4,565,731 A * 1/1986 Komatsu et al. ............. 428/212
5,382,487 A * 1/1995 Fukuda et al. .............. 430/58.1
6,239,453 B1 * 5/2001 Yamada et al. ................ 257/79
6,730,934 B2 * 5/2004 Yamada et al. ................ 257/79
2003/0151107 A1 * 8/2003 Yamada et al. .............. 257/431
2008/0217611 A1 * 9/2008 Nakamura et al. ............ 257/43
2008/0290286 A1 * 11/2008 Saito et al. ............. 250/370.11
2009/0146072 A1 * 6/2009 Saito et al. ............. 250/370.09

FOREIGN PATENT DOCUMENTS

| JP | 2001-237460 | 8/2001 |
| JP | 2003-142700 | 5/2003 |
| JP | 2004-119525 | 4/2004 |
| JP | 2004-172166 | 6/2004 |

OTHER PUBLICATIONS

PCT/JP2006/318131 dated Oct. 24, 2006 International Search Report.
PCT/JP2006/318131 dated Oct. 24, 2006 Written Opinion.

* cited by examiner

*Primary Examiner*—Ngan Ngo
(74) *Attorney, Agent, or Firm*—Dickstein, Shapiro, LLP.

(57) ABSTRACT

The ultraviolet sensor has a ZnO layer composed of an oxide semiconductor including ZnO; a (Ni,Zn)O layer which is provided in contact with the ZnO layer and which is composed of an oxide semiconductor including NiO and ZnO solid-solved therein; a first terminal electrode electrically connected to the ZnO layer, and a second terminal electrode electrically connected to the (Ni,Zn)O layer. The ZnO layer is disposed at an ultraviolet ray receiving side. The (Ni,Zn)O layer is preferably formed of a sintered body.

14 Claims, 3 Drawing Sheets

ULTRAVIOLET SENSOR

CROSS REFERENCE TO RELATED APPLICATIONS

The present application is a continuation of International Application No. PCT/JP2006/318131, filed Sep. 13, 2006, which claims priority to Japanese Patent Application No. JP2006-120208, filed Apr. 25, 2006, the entire contents of each of these applications being incorporated herein by reference in their entirety.

FIELD OF THE INVENTION

The present invention relates to an ultraviolet sensor, and more particularly relates to a diode-type ultraviolet sensor having a laminate structure which forms a hetero junction.

BACKGROUND OF THE INVENTION

An ultraviolet sensor has been used, for example, as a flame sensor for a fire alarm device or a combustion monitoring device of a burner and, in addition, has also been used as an ultraviolet detection device of a simple apparatus measuring the amount of ultraviolet radiation in an outdoor environment. Furthermore, an ultraviolet sensor has also been expected as a next-generation optical communication device which uses ultraviolet rays.

As the ultraviolet sensor, for example, a sensor using a diamond semiconductor or a SiC semiconductor have been developed and have been already produced on a commercial basis. However, in the case of the ultraviolet sensor using a diamond semiconductor or a SiC semiconductor as described above, there have been problems in that materials therefor cannot be easily machined and are also very expensive.

Hence, in recent years, research on ultraviolet sensor using an oxide semiconductor material has been pursued, and for example, a diode-type sensor having sensitivity in an ultraviolet region has been proposed, the structure of which has a hetero junction formed from an n-type semiconductor layer primarily composed of a titanium oxide and a thin film composed of a transition metal oxide (see, for example, Patent Document 1). In the ultraviolet sensor disclosed in this Patent Document 1, the n-type semiconductor layer primarily composed of titanium oxide is formed of a single crystalline substrate, and the transition metal oxide film is formed of a thin film obtained by epitaxial growth. In this case, the single crystalline substrate and the thin film described above are processed by a heat treatment, such as annealing, but these are not sintered bodies. In addition, in the ultraviolet sensor disclosed in the Patent Document 1, the transition metal oxide thin film is disposed at an ultraviolet ray receiving side.

However, the ultraviolet sensor disclosed in the Patent Document 1 has the following problems.

Since the n-type semiconductor layer primarily composed of a titanium oxide, which is used at a base side of the ultraviolet sensor, has high intrinsic resistance, the electrical conductivity is low, and hence the sensitivity of the ultraviolet sensor is relatively low. The properties described above are backed up, for example, by data shown in FIG. 5 of the Patent Document 1. In addition, since the transition metal oxide thin film is disposed at the light receiving side, the light transmission rate is also low. By the configuration described above, the sensitivity is also degraded.

Patent Document 1: Japanese Unexamined Patent Application Publication No. 2004-172166

SUMMARY OF THE INVENTION

Accordingly, an object of the present invention is to provide an ultraviolet sensor that can solve the problems described above.

In order to solve the above-described technical problems, an ultraviolet sensor of the present invention comprises: a ZnO layer composed of an oxide semiconductor including ZnO; a (Ni,Zn)O layer which is provided in contact with the ZnO layer and which is composed of an oxide semiconductor including NiO and ZnO solid-solved therein; a first terminal electrode electrically connected to the ZnO layer, and a second terminal electrode electrically connected to the (Ni,Zn)O layer. In the above ultraviolet sensor, the ZnO layer is used to be disposed at an ultraviolet ray receiving side.

In the present invention, the ZnO layer preferably contains 0.1 to 3 molar percent of Co.

In addition, when the composition of the (Ni,Zn)O layer is represented by $(Ni_{1-x}Zn_x)O$, $0.2 \leq x \leq 0.4$ preferably holds.

The ultraviolet sensor of the present invention may further comprise a conductive layer which is provided in contact with the (Ni,Zn)O layer at a side of the (Ni,Zn)O layer opposite to that at which the ZnO layer is located and which includes an electrical conductive ceramic sintered body.

The conductive layer preferably includes a transition metal oxide. In this case, the transition metal oxide is preferably a perovskite oxide represented by $ABO_3$ (where A is one selected from the group consisting of a rare earth element, Sr and Ba, or a solid solution containing at least one selected from the group consisting of a rare earth element, Sr and Ba; and B is one selected from the group consisting of Mn, Co, and Ni or a solid solution containing at least one selected from the group consisting of Mn, Co, and Ni).

The ultraviolet sensor according to the present invention may further comprise a substrate layer which is provided to reinforce at least the ZnO layer and the (Ni,Zn)O layer at a side of the (Ni,Zn)O layer opposite to that at which the ZnO layer is located and which includes a high resistance material. In this case, as the high resistance material, NiO or a material primarily composed of NiO may be advantageously used.

In the present invention, the (Ni,Zn)O layer preferably includes a sintered body. In this case, the ZnO layer more preferably includes a sintered body which is obtained by simultaneous firing with the (Ni,Zn)O layer.

The ultraviolet sensor according to the present invention may further comprise a light-transmissive conductive film on a primary surface of the ZnO layer at an ultraviolet ray receiving side.

In the ultraviolet sensor according to the present invention, when a depletion layer formed at a junction portion between an n-type ZnO layer and a p-type (Ni,Zn)O layer is irradiated with ultraviolet rays, carriers are excited, and a photocurrent is generated thereby; hence, by detecting this photocurrent, the ultraviolet rays are detected. Since the bandgap of ZnO and that of (Ni,Zn)O are large, and excitation energy excited in the depletion layer at the junction portion is high, such as 3.2 to 3.7 eV, carrier excitation occurs only by ultraviolet rays. In addition, in this ultraviolet sensor, the ZnO layer has a relatively high light transmission property, the (Ni,Zn)O layer conversely has no light transmission property, and the ZnO layer is disposed at an ultraviolet ray receiving side; hence, absorption efficiency of ultraviolet rays at the interface between the ZnO layer and the (Ni,Zn)O layer can be increased. Furthermore, by forming the junction between the ZnO layer and the (Ni,Zn)O layer, a dark current can be decreased, and hence, ultraviolet rays can be detected even if the amount thereof is small. Accordingly, by the ultraviolet sensor of the present invention, a high sensitivity, particularly to ultraviolet rays, can be obtained.

In this present invention, when the ZnO layer contains 0.1 to 3 molar percent of Co, the sensitivity can be improved because of a further decrease in dark current. In this case, when the content of Co is more than 3 molar percent, the sensitivity is adversely degraded due to the degradation in light transmission rate. On the other hand, the lower limit of the Co content is not particularly limited since the effect can be actually obtained even when the Co content is, for example, on the order of ppm; however, the reason the lower limit is set to 0.1 molar percent as described above is to clearly define the range of the content.

In the present invention, when the composition of the (Ni, Zn)O layer is represented by $(Ni_{1-x}Zn_x)O$, and when $0.2 \leq x \leq 0.4$ holds, the sensitivity of the ultraviolet sensor can be stabilized. As for the above preferable range of x, when x is less than 0.2, the resistance of the (Ni,Zn)O layer may undesirably increase, and when the ZnO layer and the (Ni, Zn)O layer are obtained by simultaneous firing, a junction defect may occur between the layers thereof; hence, due to the above defect, the output may decrease in some cases. On the other hand, when x is more than 0.4, and the (Ni,Zn)O layer is obtained by firing, ZnO grains are generated in this (Ni, Zn)O layer, and a good junction interface with the ZnO layer may not be formed, so that the output may decrease in some cases.

In the present invention, when a conductive layer composed of a ceramic sintered body is provided so as to be in contact with the (Ni,Zn)O layer, this conductive layer can be made to function as a reinforcing means for reinforcing a laminate structure formed of the ZnO layer and the (Ni,Zn)O layer. In addition, as for the second terminal electrode electrically connected to the (Ni,Zn)O layer, besides an embodiment in which the connection is made on the (Ni,Zn)O layer, an embodiment in which the connection is made on the conductive layer can be performed, so that the degree of design freedom can be enhanced.

In the present invention, when the substrate layer composed of a high resistance material is provided to reinforce at least the ZnO layer and the (Ni,Zn)O layer, a mechanical strength of the ultraviolet sensor can be increased. In particular, when the above high resistance material is NiO or is a material primarily composed of NiO, a laminate structure composed of the substrate layer, the (Ni,Zn)O layer formed thereon, and the ZnO layer formed on the (Ni,Zn)O layer can be obtained by simultaneous firing without causing any problems.

In the present invention, when the (Ni,Zn)O layer is formed of a sintered body, fine irregularities are likely to be formed at the interface between the (Ni,Zn)O layer and the ZnO layer. Accordingly, the area of the interface is increased, and light is likely to be absorbed since diffuse reflection occurs; hence, a higher sensitivity can be obtained.

In the above embodiment, when the ZnO layer is also formed of a sintered body and is obtained by simultaneous firing with the (Ni,Zn)O layer, the ultraviolet sensor can be efficiently manufactured.

In the present invention, when the light-transmissive conductive film is provided on the primary surface of the ZnO layer at an ultraviolet ray receiving side, since this light-transmissive conductive film functions to decrease the resistance of the ZnO layer in the primary surface direction, current loss is reduced, and the photocurrent is increased, thereby improving the sensitivity.

Figure 1:
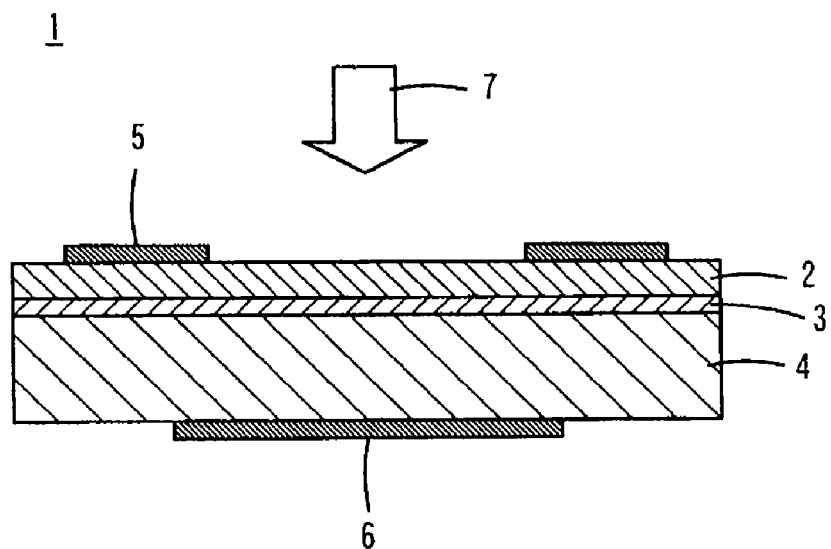
FIG. 1 is a cross-sectional view showing an ultraviolet sensor according to a first embodiment of the present invention.

REFERENCE NUMERALS 1, 1a, 11, 21 ultraviolet sensor
2, 12 ZnO layer
3, 13 (Ni,Zn)O layer
4 conductive layer
5, 6, 17, 19 terminal electrode
7 arrow indicating irradiation direction of ultraviolet rays
10 light-transmissive conductive film
14 substrate layer
16, 18 connection conductive film

DETAILED DESCRIPTION OF THE INVENTION

FIG. 1 is a cross-sectional view showing an ultraviolet sensor 1 according to a first embodiment of the present invention.

The ultraviolet sensor 1 has a ZnO layer 2 composed of an oxide semiconductor including ZnO and an (Ni,Zn)O layer 3 which is provided in contact with the ZnO layer 2 and which is composed of an oxide semiconductor including NiO and ZnO solid-solved therein. In addition, at a side of the (Ni, Zn)O layer 3 opposite to that at which the ZnO layer 2 is located, a conductive layer 4 composed of a ceramic sintered body having conductivity is provided in contact with the (Ni,Zn)O layer 3. Furthermore, a first terminal electrode 5 electrically connected to the ZnO layer 2 is provided on an external surface thereof, and on the other hand, an external surface of the conductive layer 4, a second terminal electrode 6 electrically connected to the (Ni,Zn)O layer 3 via this conductive layer 4 is provided.

Although the ZnO layer 2 is composed of an oxide semiconductor including ZnO as described above, as long as being primarily composed of ZnO, the ZnO layer 2 may include Al, Co, In, Ga, or the like as an dopant; an Fe group element, such as Fe, Ni, or Mn, as a diffuse matter; and Zr, Si, or the like as an impurity. In particular, Zr may be included in some cases as a contamination generated from a medium used in pulverization.

In the ZnO layer 2, in particular, Co is preferably contained. The reason for this is that when Co is contained, a dark current is decreased, and as a result, the sensitivity is improved. In addition, when the content of Co is more than 3 molar percent, since the light transmission rate is decreased, and the sensitivity is degraded thereby, it is not preferable.

The (Ni,Zn)O layer 3 has a composition represented by $(Ni_{1-x}Zn_x)O$, and x is preferably set in the range which satisfies $0.2 \leq x \leq 0.4$. The reason for this is that superior sensitivity can be stably obtained. When x is less than 0.2, in the case in which the ZnO layer 2 and (Ni,Zn)O layer 3 are obtained by simultaneous firing, since a superior junction state therebetween may not be obtained, or the resistance of the (Ni,Zn)O layer 3 may increase, the output of the ultraviolet sensor 1 may decrease in some cases. On the other hand, when x is more than 0.4, in the case in which the (Ni,Zn)O layer is obtained by firing, ZnO grains are generated in the (Ni,Zn)O layer 3, and a good junction interface with the ZnO layer 2 cannot be obtained, so that the output of the ultraviolet sensor 1 may decrease in some cases.

The (Ni,Zn)O layer 3 is preferably formed of a sintered body. When the (Ni,Zn)O layer 3 is formed of a sintered body, due to grain growth performed during firing, fine irregularities are inevitably formed on the surface thereof, that is, on the interface with the ZnO layer 2. Since the irregularities described above increase an effective light receiving area and impart a property which is likely to absorb light by diffuse reflection to the interface, as a result, the light receiving sensitivity can be improved.

The ZnO layer 2 described above may be formed of a thin film; however, also in this case, the ZnO layer 2 is preferably formed of a sintered body. The reason for this is that when the ZnO layer 2 is formed of a sintered body, it can be obtained by simultaneous firing with the above (Ni,Zn)O layer 3, and the productivity of the ultraviolet sensor 1 can be improved.

The conductive layer 4 preferably contains a transition metal oxide, and this transition metal oxide is preferably a perovskite oxide represented by $ABO_3$ having electrical conductivity (where A is one element selected from the group consisting of a rare earth element, Sr and Ba, or a solid solution containing at least one element selected from the group consisting of a rare earth element, Sr and Ba; and B is one element selected from the group consisting of Mn, Co, and Ni or a solid solution containing at least one element selected from the group consisting of Mn, Co, and Ni). When A is one element selected from the group consisting of a rare earth element, Sr and Ba, and B is one element selected from the group consisting of Mn, Co, and Ni, $ABO_3$ is, for example, $LaMnO_3$, $LaNiO_3$, or $SrMnO_3$. When A is a solid solution containing at least one element selected from the group consisting of a rare earth element, Sr and Ba, and B is a solid solution containing at least one element selected from the group consisting of Mn, Co, and Ni, $ABO_3$ is, for example, $(La_{0.7}Sr_{0.3})MnO_3$ or $(La_{0.7}Sr_{0.3})(Mn_{0.7}CO_{0.3})O_3$.

In addition, besides a material including a transition metal oxide, the conductive layer 4 may be formed of any material as long as it has a relatively high electrical conductivity. Since the conductive layer 4 also functions to reinforce the ZnO layer 2 and the (Ni,Zn)O layer 3 as described above, a material having a relatively high mechanical strength is preferably used. In addition, the conductive layer 4 is preferably formed of a sintered body.

In the ultraviolet sensor 1 as described above, the ZnO layer 2 is used to be disposed at an ultraviolet ray receiving side as shown in FIG. 1 in which an irradiation direction of ultraviolet rays is indicated by an arrow 7, and the primary surface in the direction toward the outside of the ZnO layer 2 is used as an ultraviolet ray receiving surface. The point described above is significantly different from that described in the Patent Document 1. According to the Patent Document 1, as described above, the transition metal oxide thin film corresponding to the conductive layer 4 is located at an ultraviolet ray receiving side.

In order to maintain a uniform distance between the above light receiving portion and the terminal electrode 5, the terminal electrode 5 is preferably formed to have a ring shape. Although the terminal electrode 5 is located inside the periphery of the ZnO layer 2 in the embodiment shown in FIG. 1, it may also be located so as to be in contact with the periphery of the ZnO layer 2. In the latter case, since a larger area of the light receiving portion can be formed at the center of the ZnO layer 2, and in addition, since a shadow of a wire terminal (not shown in the figure) can be easily made not to be projected, the light receiving efficiency can be easily improved.

The ultraviolet sensor 1 can be manufactured, for example, as describe below.

A green sheet to be formed into the conductive layer 4, a green sheet to be formed into the (Ni,Zn)O layer 3, and a green sheet to be formed into the ZnO layer 2 are respectively prepared.

The green sheet to be formed into the conductive layer 4 is formed, for example, by adding an organic solvent, a dispersing agent, a binder, and a plasticizer to a powdered inorganic starting material containing a transition metal oxide, followed by mixing to obtain a slurry, and forming the slurry into a sheet.

The green sheet to be formed into the (Ni,Zn)O layer 3 is formed by adding an organic solvent, a dispersing agent, a binder, and a plasticizer to a calcined powder obtained by calcinating a mixed powder formed by mixing powdered NiO and powdered ZnO at a predetermined ratio, followed by mixing to obtain a slurry, and forming the slurry into a sheet.

The green sheet to be formed into the ZnO layer 2 is formed by adding an organic solvent, a dispersing agent, a binder, and a plasticizer to a powdered inorganic starting material containing ZnO, followed by mixing to obtain a slurry, and forming the slurry into a sheet.

As the green sheet to be formed into the conductive layer 4, for example, a sheet having a thickness of 50 μm is prepared, and 10 green sheets thus prepared are laminated to each other to have an overall thickness of 0.5 mm. However, this is merely one example, and as long as being able to impart a sufficient strength as a base side of the ultraviolet sensor 1, the overall thickness may be arbitrarily set, for example, in the range of 0.1 to 1 mm and preferably in the range of 0.2 to 0.6 mm. When a material strength and reduction in thickness are both taken into consideration, a thickness in the range of 0.2 to 0.6 mm is appropriate. In addition, when the green sheets to be formed into the conductive layer 4 are laminated to each other, the thickness and the number of the green sheets to be laminated may be arbitrarily changed. In addition, without performing lamination, the conductive layer 4 may be formed from one green sheet.

The thickness of the green sheet to be formed into the (Ni,Zn)O layer 3 is set, for example, to 5 μm; however, the thickness is not particularly limited.

The thickness of the green sheet to be formed into the ZnO layer 2 is set, for example, to 10 μm; however, the thickness may be arbitrarily selected in the range of 1 to 50 μm, preferably in the range of 5 to 30 μm, and more preferably in the range of 5 to 20 μm. Since the green sheet can be formed by a known sheet forming method, such as a doctor blade method, the thickness of the green sheet may be arbitrarily set as desired. When the thickness of the ZnO layer 2 is excessively small, since the resistance in the primary surface direction (direction perpendicular to the thickness direction) of the ZnO layer 2 increases, the sensitivity at the central portion of the light receiving surface is degraded. On the other hand, when the thickness of the ZnO layer 2 is excessively large, although the resistance decreases, the light transmission rate is also decreased. Hence, it is required that the thickness be set in the appropriate range described above.

Next, on the green sheet thus prepared to be formed into the conductive layer 4, the green sheet to be formed into the (Ni,Zn)O layer 3 is laminated, and the green sheet to be formed into the ZnO layer 2 is further laminated thereon, followed by pressure bonding. Subsequently, whenever necessary, the laminate thus formed is cut into a piece having a size of 10 mm square. However, this cut dimension may be further decreased as the sensitivity is improved, and for example, a piece having 2 to 8 mm square may also be formed. In addition, the cut shape, in other words, the external shape of the ultraviolet sensor 1, is generally rectangular when viewed in plan; however, for example, a circular shape may also be formed.

Next, a green laminate structure thus obtained by cutting is, for example, sufficiently degreased at 450° C., followed by firing for 5 hours at 1,200 to 1,350° C. Accordingly, a fired laminate structure is obtained.

Next, the terminal electrode 5 is formed on a primary surface of the laminate structure at the ZnO layer 2 side, and the terminal electrode 6 is also formed on a primary surface at the conductive layer 4 side. For the formation of the terminal electrodes 5 and 6, for example, a sputtering method, a deposition method, a printing method, a coating method, or a plating method may be used. When a printing method is used, a conductive paste containing glass frit may be baked, or a conductive adhesive containing a curable resin may be cured. The area (width) and the thickness of the terminal electrodes 5 and 6 may be arbitrarily changed.

In a preferable embodiment, as a conductive component of the terminal electrode 5, Al is used, and as a conductive component of the terminal electrode 6, Au is used. However, the conductive components of the respective terminal electrodes 5 and 6 are not limited thereto. For example, Au may be used for the terminal electrode 5, Al may be used for the terminal electrode 6, and a metal such as Ag, Cu, Ni, Pd, or Zn, or an alloy containing at least one of the above metals may also be used.

The terminal electrode 5 formed on the ZnO layer 2 preferably contains Al or Zn as a conductive component in view of ohmic properties. However, due to influence of a photoelectromotive force on the ZnO layer 2, the ohmic property is not always necessary. The reason for this is that since the terminal electrode 5 functions as a series resistance when it is regarded as resistance, although the absolute value is influenced when sensing is performed, the relative value is not influenced.

By the steps as described above, the ultraviolet sensor 1 is obtained.

In the ultraviolet sensor 1 as described above, in order to prevent a photocurrent from flowing through end portions of the conductive layer 4, the (Ni,Zn)O layer 3, and the ZnO layer 2, and in order to reduce a leak current thereby, although not being shown in the figure, an insulating means may be provided on the external surface of the laminate structure.

In addition, a protective means made of a plastic or the like for protecting the ultraviolet sensor 1 may be provided so as not to interfere with light reception at the light receiving portion.

In addition, the ultraviolet sensor 1 may be supplied as an independent chip electronic component or a module component mounted on a circuit board or the like.

In addition, the ultraviolet sensor 1 may be applied, for example, to the following applications, that is, ultraviolet detection, which is used in a process industrially using ultraviolet rays for an ultraviolet curable resin, ultraviolet laser, or the like or which is used for a product, such as an ultraviolet cut glass, manufactured in order to cut ultraviolet rays; a flame sensor; combustion monitoring; discharge phenomenon detection; leakage detection of ultraviolet rays; an ultraviolet switch; an ultraviolet tester (hybridizable with a current sensor); an ultraviolet cut glass; a tanning machine or an ultraviolet kit for checking sunburn in daily life; an optical communication device using ultraviolet rays; a toy using ultraviolet rays; and other electronic devices.

Figure 2:
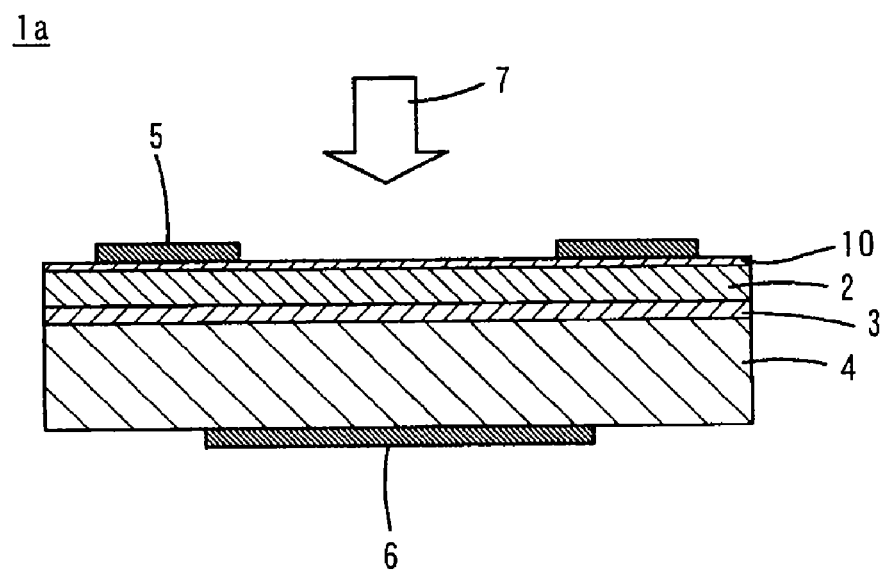
FIG. 2 is a cross-sectional view showing an ultraviolet sensor according to a second embodiment of the present invention.

FIG. 2 is a cross-sectional view showing an ultraviolet sensor 1a according to a second embodiment of the present invention. In FIG. 2, constituent elements corresponding to those shown in FIG. 1 are designated by reference numerals similar to those described above, and duplicated description is omitted.

The ultraviolet sensor 1a shown in FIG. 2 further includes a light-transmissive conductive film 10 provided on the primary surface of the ZnO layer 2 at an ultraviolet ray receiving side. Hence, the terminal electrode 5 is provided on the light-transmissive conductive film 10, and in addition, a primary surface thereof in a direction toward the outside is used as an ultraviolet ray receiving surface.

The light-transmissive conductive film 10 is formed of ZnO having a resistance decreased by Al doping. In addition, the light-transmissive conductive film 10 is formed, for example, by a sputtering method, and the thickness is set to approximately 0.5 to 1 μm.

The light-transmissive conductive film 10 functions to decrease the resistance of the ZnO layer 2 in the primary surface direction (direction perpendicular to the thickness direction). Hence, current loss by the ZnO layer 2 is reduced, and the photocurrent is increased, so that the current sensitivity can be improved.

Next, experimental examples performed in order to confirm the advantages of the present invention will be described.

1. Experimental Example 1

First, in order to form a green sheet to be used as a ZnO layer, powdered inorganic starting materials, ZnO, $Al_2O_3$, and $Co_3O_4$, were weighed so as to obtain molar percents shown in the column "ZnO layer composition" of Table 1 in the form of ZnO, $AlO_{3/2}$, and $CoO_{4/3}$, respectively, and after pure water was added thereto, a mixing and pulverizing treatment was performed by a ball mill using PSZ (partially stabilized zirconia) beads as a medium to have an average particle diameter of 0.5 μm or less. Next, after a slurry obtained by the mixing and pulverizing treatment was dehydrated and dried, the slurry was granulated to have a particle diameter of approximately 50 μm, and calcination was then performed for 2 hours at 1,200° C. Subsequently, after pure water was again added to the calcined powder thus obtained, a mixing and pulverizing treatment was performed by a ball mill using PSZ beads as a medium to obtain an average particle diameter of 0.5 μm. Next, after a slurry obtained by this mixing and pulverizing treatment was dehydrated and dried, an organic solvent and a dispersing agent were added thereto and mixed therewith, and a binder and a plasticizer were further added, so that a molding slurry was formed. By applying a doctor blade method to this slurry, a green sheet having a thickness of 10 μm to be formed into the ZnO layer was obtained.

In addition, in order to form a green sheet to be used as a (Ni,Zn)O layer, powdered NiO and powdered ZnO were weighed so as to obtain ratios shown in the column "NiO:ZnO Ratio of (Ni,Zn)O layer" of Table 1, and after pure water was added thereto, a mixing and pulverizing treatment was performed by a ball mill using PSZ beads as a medium. Next, after a slurry obtained by the mixing and pulverizing treatment was dehydrated and dried, the slurry was granulated to have a particle diameter of approximately 50 μm, and calcination was then performed for 2 hours at 1,200° C. Subsequently, after pure water was again added to the calcined powder thus obtained, a mixing and pulverizing treatment was performed by a ball mill using PSZ beads as a medium to have an average particle diameter of 0.5 μm. Next, after a slurry obtained by this mixing and pulverizing treatment was dehydrated and dried, an organic solvent and a dispersing agent were added thereto and mixed therewith, and a binder and a plasticizer were further added, so that a molding slurry was formed. By applying a doctor blade method to this slurry, a green sheet having a thickness of 5 μm to be formed into the (Ni,Zn)O layer was obtained.

Furthermore, in order to form a green sheet to be used as a conductive layer, powdered inorganic starting materials, $La_2O_3$, $SrCO_3$, $BaCO_3$, $Mn_3O_4$, $Co_3O_4$, and NiO, were weighed so as to obtain molar percents shown in the column "conductive layer composition" of Table 1 in the form of $LaO_{3/2}$, $SrCO_3$, $BaCO_3$, $MnO_{4/3}$, $CoO_{4/3}$, and NiO, respectively, and after pure water was added thereto, a mixing and pulverizing treatment was performed by a ball mill using PSZ beads as a medium. Next, after a slurry obtained by the mixing and pulverizing treatment was dehydrated and dried, the slurry was granulated to have a particle diameter of approximately 50 μm, and calcination was then performed for 2 hours at 1,200° C. Subsequently, after pure water was again added to the calcined powder thus obtained, a mixing and pulverizing treatment was performed by a ball mill using PSZ beads as a medium to have an average particle diameter of 0.5 μm. Next, after a slurry obtained by this mixing and pulverizing treatment was dehydrated and dried, an organic solvent and a dispersing agent were added thereto and mixed therewith, and a binder and a plasticizer were further added, so that a molding slurry was formed. By applying a doctor blade method to this slurry, a green sheet having a thickness of 50 μm to be formed into the conductive layer was obtained.

TABLE 1

| | ZnO LAYER COMPOSITION (MOLAR PERCENT) | | | NiO:ZnO RATIO of | CONDUCTIVE LAYER COMPOSITION (MOLAR PERCENT) | | | | | |
|---|---|---|---|---|---|---|---|---|---|---|
| SAMPLE NO. | ZnO | $AlO_{3/2}$ | $CoO_{4/3}$ | (Ni, Zn)O LAYER | $LaO_{3/2}$ | $SrCO_3$ | $BaCO_3$ | $MnO_{4/3}$ | $CoO_{4/3}$ | NiO |
| 1 | 99.99 | 0.01 | 0 | 90:10 | 35 | 15 | 0 | 50 | 0 | 0 |
| 2 | 99.99 | 0.01 | 0 | 80:20 | 35 | 15 | 0 | 50 | 0 | 0 |
| 3 | 99.99 | 0.01 | 0 | 70:30 | 35 | 15 | 0 | 50 | 0 | 0 |
| 4 | 99.99 | 0.01 | 0 | 60:40 | 35 | 15 | 0 | 50 | 0 | 0 |
| 5 | 99.99 | 0.01 | 0 | 50:50 | 35 | 15 | 0 | 50 | 0 | 0 |
| 6 | 99.99 | 0.01 | 0 | 90:10 | 35 | 0 | 15 | 50 | 0 | 0 |
| 7 | 99.99 | 0.01 | 0 | 80:20 | 35 | 0 | 15 | 50 | 0 | 0 |
| 8 | 99.99 | 0.01 | 0 | 70:30 | 35 | 0 | 15 | 50 | 0 | 0 |
| 9 | 99.99 | 0.01 | 0 | 60:40 | 35 | 0 | 15 | 50 | 0 | 0 |
| 10 | 99.99 | 0.01 | 0 | 50:50 | 35 | 0 | 15 | 50 | 0 | 0 |
| 11 | 99.99 | 0.01 | 0 | 80:20 | 40 | 10 | 0 | 0 | 50 | 0 |
| 12 | 99.99 | 0.01 | 0 | 70:30 | 40 | 10 | 0 | 0 | 50 | 0 |
| 13 | 99.99 | 0.01 | 0 | 60:40 | 40 | 10 | 0 | 0 | 50 | 0 |
| 14 | 99.99 | 0.01 | 0 | 50:50 | 40 | 10 | 0 | 0 | 50 | 0 |
| 15 | 99.99 | 0.01 | 0 | 90:10 | 40 | 10 | 0 | 0 | 0 | 50 |
| 16 | 99.99 | 0.01 | 0 | 80:20 | 40 | 10 | 0 | 0 | 0 | 50 |
| 17 | 99.99 | 0.01 | 0 | 70:30 | 40 | 10 | 0 | 0 | 0 | 50 |
| 18 | 99.99 | 0.01 | 0 | 60:40 | 40 | 10 | 0 | 0 | 0 | 50 |
| 19 | 99.99 | 0.01 | 0 | 50:50 | 40 | 10 | 0 | 0 | 0 | 50 |
| 20 | 98.99 | 0.01 | 1 | 90:10 | 35 | 15 | 0 | 50 | 0 | 0 |
| 21 | 98.99 | 0.01 | 1 | 80:20 | 35 | 15 | 0 | 50 | 0 | 0 |
| 22 | 98.99 | 0.01 | 1 | 70:30 | 35 | 15 | 0 | 50 | 0 | 0 |
| 23 | 98.99 | 0.01 | 1 | 60:40 | 35 | 15 | 0 | 50 | 0 | 0 |
| 24 | 98.99 | 0.01 | 1 | 50:50 | 35 | 15 | 0 | 50 | 0 | 0 |

Next, in order to obtain the ultraviolet sensor 1 having the structure as shown in FIG. 1, 10 green sheets described above to be formed into the conductive layer were laminated to each other, one green sheet to be formed into the (Ni,Zn)O layer and one green sheet to be formed into the ZnO layer were sequentially laminated thereon and were then pressure-boned at a pressure of 20 MPa, and a laminate thus formed was cut into a size of 10 mm by 10 mm.

Next, a green laminate structure obtained by cutting as described above was slowly and sufficiently degreased at 450° C., followed by firing at 1,250° C. for 5 hours.

Next, an Al film was formed by a deposition method on a part of the primary surface of the sintered laminate structure at the ZnO layer side to form one terminal electrode, and a Au film was formed by a sputtering method on a part of the primary surface at the conductive layer side to form the other terminal electrode.

Figure 3:
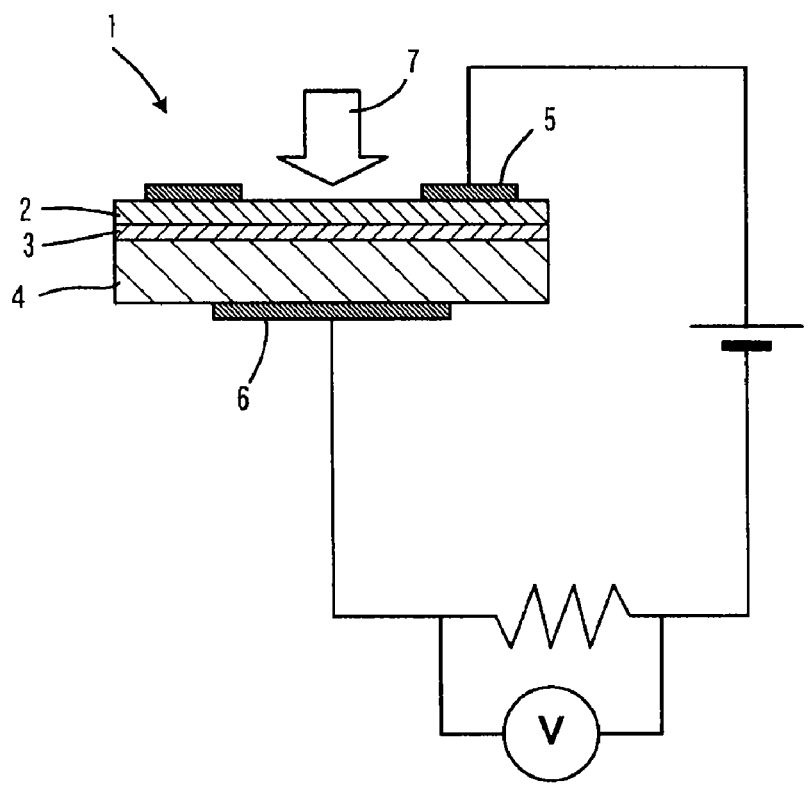
FIG. 3 is a circuit view showing a photocurrent measurement device used in an experimental example.

To the ultraviolet sensor 1 which was the sample obtained as described above, as shown in FIG. 3, a bias voltage of 1 V was applied so that the terminal electrode 5 at the ZnO layer 2 side was a plus side and the terminal electrode 6 at the conductive layer 4 side was a minus side, and in a darkroom, various types of light having specific wavelengths as shown in Table 2 were irradiated to the external surface at the ZnO layer 2 side as shown by an arrow 7, so that a photocurrent flowing through the ultraviolet sensor 1 used as the sample was measured. In this case, the irradiation intensities of the light were each set to 10 mW/cm², and the measurement temperature was controlled to be 25±1° C. In Table 2, the measurement results of the photocurrent are shown. Incidentally, the dark current in the table indicates a current flowing through the sample in the state in which light having a specific wavelength is not irradiated in a darkroom.

"NiO:ZnO Ratio of (Ni,Zn)O Layer" of Table 1 was changed, when the "NiO:ZnO Ratio" was in the range of "80:20" to "60:40", that is, when $0.2 \leq x \leq 0.4$ held in the $(Ni_{1-x}Zn_x)O$ layer, the properties hardly changed as shown in Table 2, in particular, between samples 2 to 4, between samples 7 to 9, between samples 11 to 13, between samples 16 to 18, and

TABLE 2

| SAMPLE NO. | 198 nm | 254 nm | 313 nm | 365 nm | 405 nm | 630 nm | FLUORESCENT LAMP | DARK CURRENT |
|---|---|---|---|---|---|---|---|---|
| 1 | 0.05 | 0.12 | 0.30 | 0.25 | 0.01 | 0.00 | 0.00 | 0.00095 |
| 2 | 0.98 | 1.56 | 1.82 | 2.03 | 0.03 | 0.00 | 0.02 | 0.00087 |
| 3 | 0.99 | 1.55 | 1.83 | 2.05 | 0.03 | 0.00 | 0.03 | 0.00058 |
| 4 | 0.98 | 1.54 | 1.83 | 2.05 | 0.03 | 0.00 | 0.02 | 0.00051 |
| 5 | 0.03 | 0.13 | 0.24 | 0.20 | 0.02 | 0.00 | 0.00 | 0.00060 |
| 6 | 0.01 | 0.05 | 0.06 | 0.07 | 0.00 | 0.00 | 0.00 | 0.00092 |
| 7 | 1.12 | 1.25 | 1.75 | 2.46 | 0.02 | 0.00 | 0.03 | 0.00090 |
| 8 | 1.13 | 1.32 | 1.76 | 2.46 | 0.02 | 0.00 | 0.01 | 0.00085 |
| 9 | 1.15 | 1.29 | 1.80 | 2.50 | 0.03 | 0.00 | 0.01 | 0.00075 |
| 10 | 0.05 | 0.08 | 0.12 | 0.20 | 0.01 | 0.00 | 0.00 | 0.00063 |
| 11 | 0.98 | 1.63 | 2.03 | 2.59 | 0.05 | 0.00 | 0.03 | 0.00043 |
| 12 | 0.97 | 1.64 | 2.04 | 2.56 | 0.07 | 0.00 | 0.02 | 0.00040 |
| 13 | 0.86 | 1.58 | 2.25 | 2.54 | 0.06 | 0.00 | 0.05 | 0.00037 |
| 14 | 0.00 | 0.06 | 0.10 | 0.11 | 0.01 | 0.00 | 0.00 | 0.00070 |
| 15 | 0.13 | 0.24 | 0.53 | 0.45 | 0.03 | 0.00 | 0.00 | 0.00079 |
| 16 | 1.16 | 1.65 | 3.24 | 2.26 | 0.12 | 0.00 | 0.12 | 0.00105 |
| 17 | 1.23 | 1.66 | 3.23 | 2.18 | 0.13 | 0.00 | 0.12 | 0.00085 |
| 18 | 1.22 | 1.67 | 3.24 | 2.20 | 0.12 | 0.00 | 0.10 | 0.00080 |
| 19 | 0.12 | 0.22 | 0.36 | 0.56 | 0.07 | 0.00 | 0.01 | 0.00090 |
| 20 | 0.02 | 0.09 | 0.28 | 0.26 | 0.00 | 0.00 | 0.00 | 0.00002 |
| 21 | 0.86 | 1.48 | 1.78 | 1.92 | 0.02 | 0.00 | 0.01 | 0.00001 |
| 22 | 0.87 | 1.46 | 1.82 | 1.92 | 0.02 | 0.00 | 0.01 | 0.00001 |
| 23 | 0.86 | 1.49 | 1.80 | 1.91 | 0.03 | 0.00 | 0.01 | 0.00001 |
| 24 | 0.06 | 0.12 | 0.33 | 0.34 | 0.00 | 0.00 | 0.00 | 0.00001 |

(UNIT: mA)

As apparent from Table 2, all samples had a small response to light having a wavelength of 405 nm and a fluorescent lamp and had no reaction to light having a wavelength of 630 nm. From the results described above, it was found that although the amount is very small, ultraviolet rays were included in light having a wavelength of 405 nm and a fluorescent lamp, and that all samples responded only to ultraviolet rays. The maximum response was performed to incidence light having a wavelength of 313 nm, and a maximum output of 3.24 mA was obtained. From the results described above, it is expected to further improve the sensitivity when the shape and the like of the terminal electrode are optimized.

The reason the response sensitivity to ultraviolet rays of the samples formed in the Experimental Example 1 was enhanced as described above is believed that since the bandgap of ZnO and that of (Ni,Zn)O are large, and carriers are excited in a depletion layer at the junction portion therebetween, the carriers are sensed as a photocurrent. In addition, the reason the current thus sensed was increased is believed that since an effective area of the junction interface between the ZnO layer and the (Ni,Zn)O layer, each formed of a sintered body, is large as compared to that of an interface formed between thin films, and the (Ni,Zn)O layer does not transmit light, the absorption efficiency of ultraviolet rays is enhanced.

In addition, in samples 20 to 24, the ZnO layer contained 1 molar percent of Co, which was in the range of 0.1 to 3 molar percent. Hence, compared to samples 1 to 19 which contained no Co as described above, the dark current was small, and an improvement in sensitivity could be confirmed.

In comparisons made between samples 1 to 5, between samples 6 to 10, between samples 11 to 14, between samples 15 to 19, and between samples 20 to 24, in each of which only between samples 21 to 23. The reason for this is believed that diffusion from the ZnO layer side and solid solution occurred.

On the other hand, when x was less than 0.2, that is, in samples 1, 6, 15, and 20 in which the "NiO:ZnO ratio" was "90:10", since the resistance of the (Ni,Zn)O layer increased, the output decreased as shown in Table 2. In addition, although a sample corresponding to one of samples 11 to 14, having a "NiO:ZnO ratio" of "90:10", is not shown in Tables 1 and 2, in the sample described above, peeling occurred between the ZnO layer and the (Ni,Zn)O layer, and hence measurement of the properties thereof could not be performed.

On the other hand, when x was more than 0.4, that is, in samples 5, 10, 14, 19 and 24 in which the "NiO:ZnO ratio" was "50:50", since ZnO grains were generated in the (Ni, Zn)O layer, a good junction interface was not generated, and as a result, as shown in Table 2, the output decreased.

2. Experimental Example 2

By using samples similar to sample 22 of the above Experimental Example 1, the influence of the presence of a light-transmissive conductive film was evaluated. That is, the same sample as sample 22 of the above Experimental Example 1 was used as a sample "without light-transmissive conductive film, and a sample equivalent to sample 22 was formed as a sample "with light-transmissive conductive film" except that a thin film of ZnO having thickness of 1 μm and a resistance decreased by Al doping was formed by a sputtering method on the external surface of the ZnO layer of the sintered laminate structure.

Next, photocurrents of the samples described above were measured by a method similar to that in the Experimental Example 1 in which a light source having a wavelength of 313 nm was used, and in which the irradiation intensity was changed. The results are shown in FIG. 4.

Figure 4:
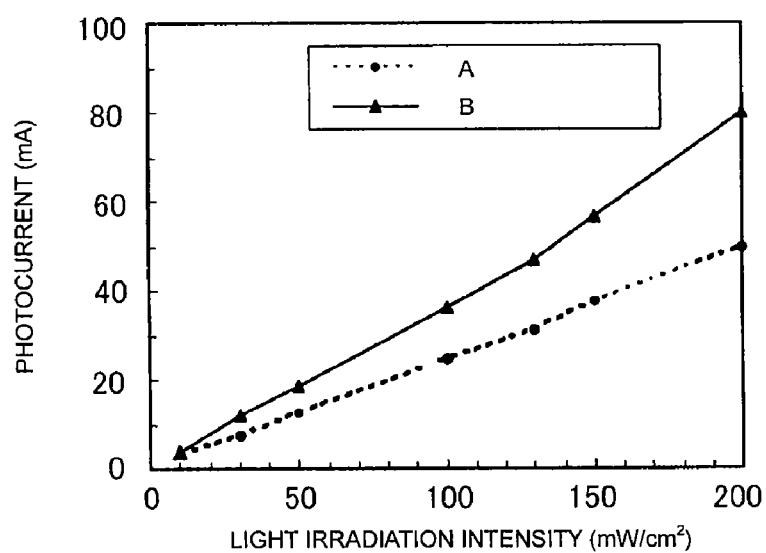
FIG. 4 is a view showing measurement results of photocurrents obtained by changing light irradiation intensity using a sample "without light-transmissive conductive film" and a sample "with light-transmissive conductive film", which are obtained in experimental example 2.

With reference to FIG. 4, it was found that according to the sample "with light-transmissive conductive film" (A), compared to the sample "without light-transmissive conductive film" (B), the light receiving efficiency was increased, and current loss with respect to the terminal electrodes was further reduced; hence, the photocurrent was increased, and the current sensitivity was improved.

Figure 5A:
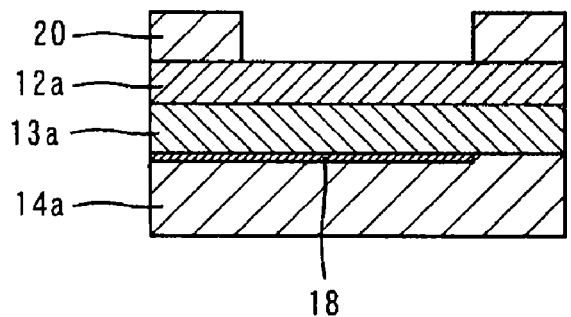
FIGS. 5(a) and 5(b) are cross-sectional views each illustrating an ultraviolet sensor according to a third embodiment of the present invention, FIG. 5(a) showing the state before a firing step which is performed in a process for manufacturing the ultraviolet sensor, and FIG. 5(b) showing the ultraviolet sensor manufactured through the state shown in FIG. 5(a).
Figure 5B:
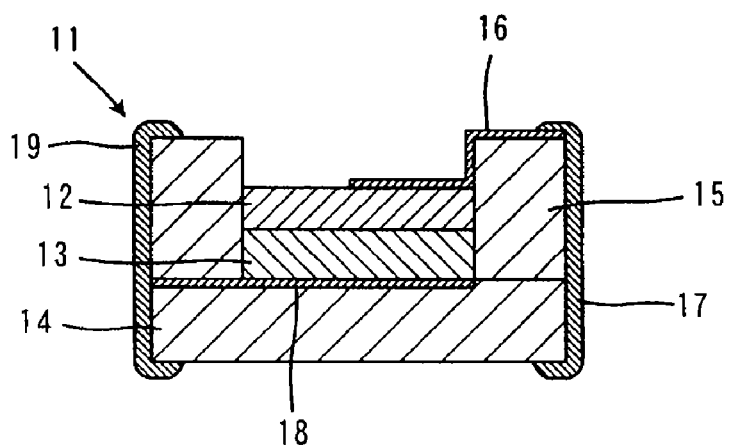

FIGS. 5(a) and 5(b) are cross-sectional views each illustrating an ultraviolet sensor 11 according to a third embodiment of the present invention. FIG. 5(a) shows the state before a firing step which is performed in a process for manufacturing the ultraviolet sensor 11, and FIG. 5(b) shows the ultraviolet sensor 11 manufactured through the state shown in FIG. 5(a).

First, with reference to FIG. 5(b), the ultraviolet sensor 11 has a ZnO layer 12 composed of an oxide semiconductor including ZnO and an (Ni,Zn)O layer 13 which is provided in contact with the ZnO layer 12 and which is composed of an oxide semiconductor including NiO and ZnO solid-solved therein.

In addition, in order to reinforce at least the ZnO layer 12 and the (Ni,Zn)O layer 13, a substrate layer 14 composed of a high resistance material is provided at a side of the (Ni,Zn)O layer 13 opposite to that at which the ZnO layer 12 is located. As the high resistance material forming the substrate layer 14, for example, NiO or a material primarily composed of NiO is used. As the material primarily composed of NiO, for example, a material containing ZnO at a content of 35 molar percent or less may be mentioned.

In addition, an insulating portion 15 is formed on the substrate layer 14 so as to cover the peripheral portions of the ZnO layer 12 and the (Ni,Zn)O layer 13. This insulating portion 15 makes a photocurrent not flow through end portions of the ZnO layer 12 and the (Ni,Zn)O layer 13 and hence functions so as to reduce a leak current.

The ultraviolet sensor 11 further has a first terminal electrode 17 electrically connected to the ZnO layer 12 through a connection conductive film 16, and a second terminal electrode 19 electrically connected to the (Ni,Zn)O layer 13 through a connection conductive film 18.

Also in the ultraviolet sensor 11 as described above, the ZnO layer 12 is used to be disposed at an ultraviolet ray receiving side, and a primary surface of the ZnO layer 12 in a direction toward the outside is used as a light receiving surface. In this embodiment, although the connection conductive film 16 connected to the first terminal electrode 17 is shown in FIG. 5(b) to cover a large part of the light receiving surface, the central portion of the light receiving surface is practically designed not to be covered with the connection conductive film 16 described above.

Next, primarily with reference to FIG. 5(a), a method for manufacturing the ultraviolet sensor 11 will be described.

First, a green substrate layer 14a to be formed into the substrate layer 14 is prepared. The green substrate layer 14a has a block shape and contains, for example, a NiO powder as a high resistance material.

Next, on the green substrate layer 14a, the connection conductive film 18 is formed by printing using a conductive paste containing platinum or the like. The connection conductive film 18 may also be formed using a conductive metal oxide.

Subsequently, a green (Ni,Zn)O layer 13a is formed on the green substrate layer 14a so as to cover the connection conductive film 18. The green (Ni,Zn)O layer 13a is formed, for example, from a green sheet and is laminated on the green substrate layer 14a.

Next, on the green (Ni,Zn)O layer 13a, a green ZnO layer 12a is formed. The green ZnO layer 12a is also formed, for example, from a green sheet and is laminated on the green (Ni,Zn)O layer 13a.

Then, on part of the green ZnO layer 12a, a green high resistance material layer 20 is formed by printing. This high resistance material layer 20 is a layer containing a high resistance material, such as NiO, (Ni,Zn)O, $Zn_2TiO_4$, or $SrTiO_3$.

Subsequently, the laminate structure shown in FIG. 5(a) is pressed, followed by firing. By this firing step, the green substrate layer 14a, the green (Ni,Zn)O layer 13a, and the green ZnO layer 12a are formed into the substrate layer 14, the (Ni,Zn)O layer 13, and the ZnO layer 12, respectively, and in addition, the connection conductive film 18 is sintered.

Furthermore, the high resistance material contained in the green high resistance material layer 20 is diffused to the peripheral portions of the ZnO layer 12 and the (Ni,Zn)O layer 13, so that the insulating portion 15 is formed. For example, when the green high resistance material layer 20 contains NiO, Ni is diffused to the ZnO layer 12 and the (Ni,Zn)O layer 13 to form the insulating portion 15, so that the resistance is increased. In addition, the connection conductive film 18 functions as a barrier against the diffusion generated in the above firing step.

Next, as shown in FIG. 5(b), for example, the connection conductive film 16 is formed by printing a conductive paste containing aluminum, followed by baking, and subsequently, for example, the terminal electrodes 17 and 19 are formed by applying a conductive paste containing silver or copper, followed by baking, so that the ultraviolet sensor 11 is completed.

Figure 6A:
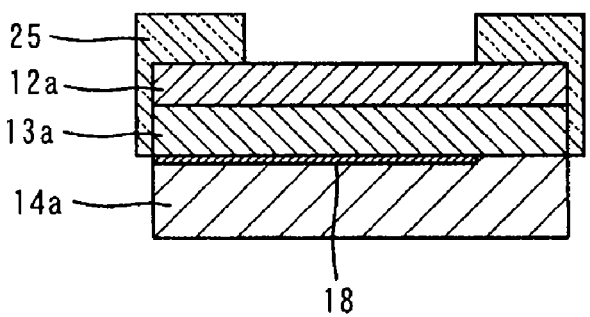
FIGS. 6(a) and 6(b) are cross-sectional views each illustrating an ultraviolet sensor according to a fourth embodiment of the present invention, FIG. 6(a) showing the state before a firing step which is performed in a process for manufacturing the ultraviolet sensor, and FIG. 6(b) showing the ultraviolet sensor manufactured through the state shown in FIG. 6(a).
Figure 6B:
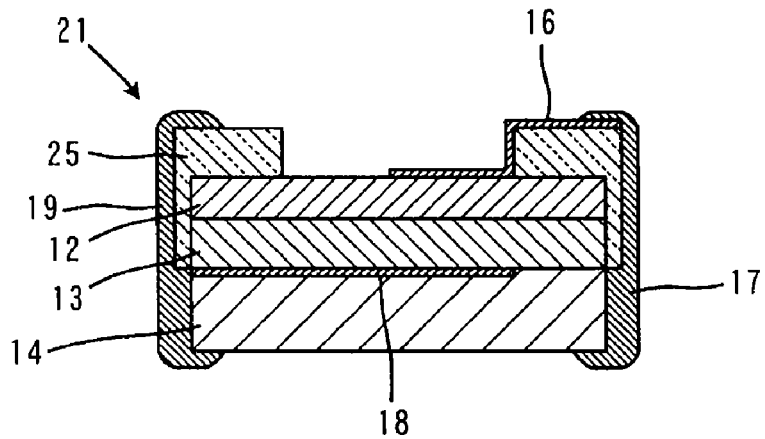

FIGS. 6(a) and 6(b) are cross-sectional views each illustrating an ultraviolet sensor 21 according to a fourth embodiment of the present invention. FIG. 6(a) shows the state before a firing step which is performed in a process for manufacturing the ultraviolet sensor 21, and FIG. 6(b) shows the ultraviolet sensor 21 manufactured through the state shown in FIG. 6(a). In FIGS. 6(a) and 6(b), constituent elements corresponding to those shown in FIGS. 5(a) and 5(b) are designated by reference numerals similar to those described above, and duplicated description is omitted.

In the ultraviolet sensor 21 shown in FIG. 6(b), instead of the insulating portion 15 shown in FIG. 5(b), an insulating portion 25 composed of a glass-base material is formed. This insulating portion 25 has a function substantially equivalent to that of the insulating portion 15.

The insulating portion 25 is formed after the green ZnO layer 12a is formed and in the step shown in FIG. 6(a) which is performed in the manufacturing. In this step, for example, by using tampo printing or the like, the insulating portion 25 can be formed so as to extend to side surfaces of the green ZnO layer 12a and the green (Ni,Zn)O layer 13a.

The invention claimed is:

1. An ultraviolet sensor comprising:
    a ZnO layer composed of an oxide semiconductor including ZnO;
    a (Ni,Zn)O layer in contact with the ZnO layer and composed of an oxide semiconductor including NiO and ZnO solid-solved therein;
    a first terminal electrode electrically connected to the ZnO layer; and
    a second terminal electrode electrically connected to the (Ni,Zn)O layer, wherein the ZnO layer is disposed at an ultraviolet ray receiving side of the ultraviolet sensor so as to have an ultraviolet ray receiving surface.

2. The ultraviolet sensor according to claim 1, wherein the ZnO layer contains 0.1 to 3 molar percent of Co.

3. The ultraviolet sensor according to claim 1, wherein when the composition of the (Ni,Zn)O layer is represented by $(Ni_{1-x}Zn_x)O$, wherein $0.2 \leq x \leq 0.4$.

4. The ultraviolet sensor according to claim 1, further comprising a conductive layer in contact with the (Ni,Zn)O layer at a side of the (Ni,Zn)O layer opposite to that of the ZnO layer, the conductive layer is located and which includes an electrical conductive ceramic sintered body.

5. The ultraviolet sensor according to claim 4, wherein the conductive layer is an electrical conductive ceramic sintered body.

6. The ultraviolet sensor according to claim 4, wherein the conductive layer includes a transition metal oxide.

7. The ultraviolet sensor according to claim 6, wherein the transition metal oxide is a perovskite oxide represented by $ABO_3$, wherein A is one element selected from the group consisting of a rare earth element, Sr and Ba, or a solid solution containing at least one element selected from the group consisting of a rare earth element, Sr and Ba; and B is one element selected from the group consisting of Mn, Co, and Ni or a solid solution containing at least one element selected from the group consisting of Mn, Co, and Ni.

8. The ultraviolet sensor according to claim 1, wherein the ZnO layer has a thickness in the range of 1 to 50 μm.

9. The ultraviolet sensor according to claim 1, wherein the (Ni,Zn)O layer has a thickness of about 5 μm.

10. The ultraviolet sensor according to claim 1, further comprising a substrate layer provided at a side of the (Ni,Zn)O layer opposite to that at which the ZnO layer is located, the substrate layer including a high resistance material.

11. The ultraviolet sensor according to claim 10, wherein the high resistance material is NiO or a material primarily composed of NiO.

12. The ultraviolet sensor according to claim 1, wherein the (Ni,Zn)O layer includes a sintered body.

13. The ultraviolet sensor according to claim 12, wherein the ZnO layer includes a sintered body which is obtained by simultaneous firing with the (Ni,Zn)O layer.

14. The ultraviolet sensor according to claim 1, further comprising a light-transmissive conductive film on the ultraviolet ray receiving surface of the ZnO layer.

* * * * *